United States Patent [19]
Gamo

[11] Patent Number: 5,670,919
[45] Date of Patent: *Sep. 23, 1997

[54] PIEZOELECTRIC FILTER

[75] Inventor: Masao Gamo, Takaoka, Japan

[73] Assignee: Murata Manufacturing Co., Ltd., Nagaokakyo, Japan

[ * ] Notice: The term of this patent shall not extend beyond the expiration date of Pat. No. 5,594,396.

[21] Appl. No.: 464,936

[22] Filed: Jun. 5, 1995

[30] Foreign Application Priority Data

Jun. 9, 1994 [JP] Japan .................. 6-127530

[51] Int. Cl.$^6$ .................................. H03H 9/00
[52] U.S. Cl. .................. 333/189; 333/191; 333/192
[58] Field of Search .................. 333/186–192; 310/365, 320

[56] References Cited

U.S. PATENT DOCUMENTS

| | | |
|---|---|---|
| 4,196,407 | 4/1980 | Masaie et al. |
| 4,234,860 | 11/1980 | Schumacher et al. |
| 4,821,004 | 4/1989 | Defranould et al. |
| 5,121,024 | 6/1992 | Seto ............... 310/320 |
| 5,166,570 | 11/1992 | Takahashi ........ 310/320 |
| 5,594,396 | 1/1997 | Hino ............... 333/185 |

FOREIGN PATENT DOCUMENTS

| | | |
|---|---|---|
| 0055636 | 1/1980 | Japan. |
| 5811316 | 1/1983 | Japan. |
| 61-227417 | 10/1986 | Japan. |
| 4-26212 | 1/1992 | Japan. |

*Primary Examiner*—Benny Lee
*Assistant Examiner*—Darin Gambino
*Attorney, Agent, or Firm*—Burns, Doane, Swecker & Mathis, LLP

[57] ABSTRACT

In a piezoelectric filter, two vibrating element parts are arranged on longitudinal side portions of a rectangular flat plate shaped piezoelectric substrate, and a capacitor is arranged therebetween. Each of the vibrating element parts comprises a pair of vibrating electrodes which are arranged on an upper surface of the piezoelectric substrate at a distance, and an opposite electrode which is arranged on a back surface of the piezoelectric substrate to be opposed to the vibrating electrodes. The pair of vibrating electrodes of each Vibrating element part is arranged along an electrode arrangement direction which is inclined with respect to side surfaces of the rectangular piezoelectric substrate. The electrode arrangement direction for the vibrating electrodes is inclined with respect to the side surfaces of the piezoelectric substrate at an angle θ of inclination which is preferably in excess of 0° and not more than 45°.

6 Claims, 7 Drawing Sheets

5,670,919

1

PIEZOELECTRIC FILTER

BACKGROUND OF THE INVENTION

1. Field of the Invention

The present invention relates to a piezoelectric filter which comprises a piezoelectric substrate and a plurality of vibrating element parts.

2. Description of the Background Art

FIGS. 7A and 7B are top and bottom plan views showing a conventional piezoelectric filter 50. FIG. 8 is an equivalent circuit diagram of the piezoelectric filter 50.

The piezoelectric filter 50 comprises two vibrating element parts 52A and 52B and a capacitor C.

The vibrating element part 52A comprises a pair of vibrating electrodes 53a and 53b which are arranged on an upper surface 51a of a piezoelectric substrate 51, and an opposite electrode 54a which is arranged on a back surface 51b of the piezoelectric substrate 51. The pair of vibrating electrodes 53a and 53b are arranged in parallel with each other at a constant distance along shorter sides 51c of the piezoelectric substrate 51. The opposite electrode 54a is opposed to the pair of vibrating electrodes 53a and 53b through the piezoelectric substrate 51.

The vibrating element part 52B also comprises a pair of vibrating electrodes 53c and 53d and an opposite electrode 54b, similarly to the vibrating element part 52A.

The capacitor C is arranged between the two vibrating element parts 52A and 52B. A capacitive electrode 55 of the capacitor C is formed on the upper surface 51a of the piezoelectric substrate 51 between the vibrating electrodes 53a and 53c. On the other hand, a ground electrode 56 is formed on the back surface 51b of the piezoelectric substrate 51, in a position opposite to the capacitive electrode 55. The capacitor C is formed by the capacitive electrode 55, the ground electrode 56 and a portion of the piezoelectric substrate 51 interposed therebetween. An input electrode 57 is provided on an end portion of the upper surface 51a of the piezoelectric substrate 51, and connected with the vibrating electrode 53b of the vibrating element part 52A. On the other hand, the vibrating electrode 53a of the vibrating element part 52A is connected with the capacitive electrode 55. Further, the opposite electrode 54a of the vibrating element part 52A is connected with the ground electrode 56.

In the vibrating element part 52B, on the other hand, the vibrating electrodes 53c and 53d are connected with the capacitive electrode 55 and an output electrode 58 respectively, while the opposite electrode 54b is connected with the ground electrode 56.

The respective vibrating element parts 52A and 52B of the piezoelectric filter 50 form multimode resonators which resonate in a thickness expansion vibration mode. When a voltage of a prescribed frequency is applied across the vibrating electrodes 53a and 53b in the vibrating element part 52A, for example, the piezoelectric substrate 51 located under the vibrating electrodes 53a and 53b resonates along the thickness direction. Through such resonance, materials for the vibrating electrodes 53a and 53b and the piezoelectric substrate 51 are properly set to form the piezoelectric filter 50 having a desired bandwidth.

When the piezoelectric substrate 51 located under the vibrating electrodes 53a and 53b resonates in an expansion vibration mode along the thickness direction, spurious vibrations are caused following expansion/contraction of the piezoelectric substrate 51 along the thickness direction. FIG. 9 typically illustrates the state of such spurious vibrations.

2

Following resonance of the vibrating element part 52A, spurious vibrations are caused in a direction of arrangement of the pair of vibrating electrodes 53a and 53b, i.e., along the shorter sides 51c of the piezoelectric substrate 51, and a direction perpendicular thereto, and propagated through the piezoelectric substrate 51 with attenuation. Similar spurious vibrations are caused also in the vibrating element part 52B, and propagated through the piezoelectric substrate 51. These spurious vibrations are excess vibration components having a vibration mode which is different from the thickness expansion vibration mode of the vibrating electrodes 53a to 53d. Therefore, the spurious attenuation is preferably maximized in the process of propagation through the piezoelectric substrate 51.

In the conventional piezoelectric filter 50 shown in FIGS. 7A and 7B, however, the vibrating electrodes 53a, 53b, 53c and 53d of the vibrating element parts 52A and 52B are arranged in parallel with each other to be symmetrical about the capacitor C on the major surface 51a of the piezoelectric substrate 51 as shown in FIG. 9, and hence a plurality of spurious vibrations $W_x$ which are propagated in a single direction interfere with each other to be amplified. Namely, the spurious attenuation is disadvantageously reduced by such interference between the spurious vibrations.

In order to prevent such interference between the spurious vibrations of the adjacent vibrating element parts 52A and 52B, the inventor has considered a countermeasure of displacing the vibrating element parts 52A and 52B from each other on the piezoelectric substrate 51 along the shorter sides 51c. In this case, however, it is consequently necessary to increase the area of the piezoelectric substrate 51, leading to hindrance of element miniaturization, which is required for the piezoelectric filter.

SUMMARY OF THE INVENTION

An object of the present invention is to provide a piezoelectric filter which can prevent interference between vibrations of a plurality of vibrating element parts for improving the spurious attenuation without hindering element miniaturization.

A piezoelectric filter according to the present invention comprises a rectangular plate shaped piezoelectric substrate having an upper surface, a back surface and side surfaces connecting the upper surface and the back surface with each other, a pair of first vibrating electrodes which are arranged on the upper surface of the piezoelectric substrate, a pair of second vibrating electrodes which are arranged on the upper surface of the piezoelectric substrate to be separated from the first vibrating electrodes, and first and second counter electrodes which are formed to be opposed to the pairs of first and second vibrating electrodes respectively through the piezoelectric substrate. A first vibrating element part is formed by the pair of first vibrating electrodes and the first counter electrode, while a second vibrating element part is formed by the pair of second vibrating electrodes and the second counter electrode. The pairs of first and second vibrating electrodes are arranged not to superpose propagation regions for vibrations along directions connecting the vibrating electrodes of the vibrating element parts with each other and those perpendicular to the directions among vibrations caused in the first and second vibrating element parts.

It is possible to prevent interference between excess oscillatory waves which are propagated from the first and second vibrating elements respectively by changing the relation of arrangement of the pairs of vibrating electrodes provided in the first and second vibrating element parts which are adjacent to each other. Thus, it is possible to prevent reduction in attenuation of spurious vibration.

In a piezoelectric filter according to a restricted aspect of the present invention, each pair of vibrating electrodes are arranged at a prescribed distance along a direction which is inclined with respect to the side surfaces of the piezoelectric substrate.

Spurious vibrations caused in each vibrating element part are mainly propagated in a direction of arrangement of the two vibration electrodes which are separated from each other, and a direction perpendicular thereto. Therefore, it is possible to displace propagation directions for oscillatory waves propagated from the first and second vibrating element parts which are arranged adjacently to each other by arranging the vibrating electrodes along directions inclined with respect to the side surfaces of the rectangular piezoelectric substrate. Thus, it is possible to prevent interference between the oscillatory waves, thereby preventing reduction in attenuation of spurious vibration.

In a piezoelectric filter according to a further restricted aspect of the present invention, the vibrating electrodes are arranged along directions which are inclined with respect to the side surfaces of the piezoelectric substrate at an angle which is in excess of 0° and not more than 45°.

In a piezoelectric filter according to a further restricted aspect of the present invention, the vibrating electrodes of the first and second vibrating elements are arranged along directions which are parallel to each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention are now described with reference to the drawings, to clarify the present invention.

First Embodiment

Figure 1A:
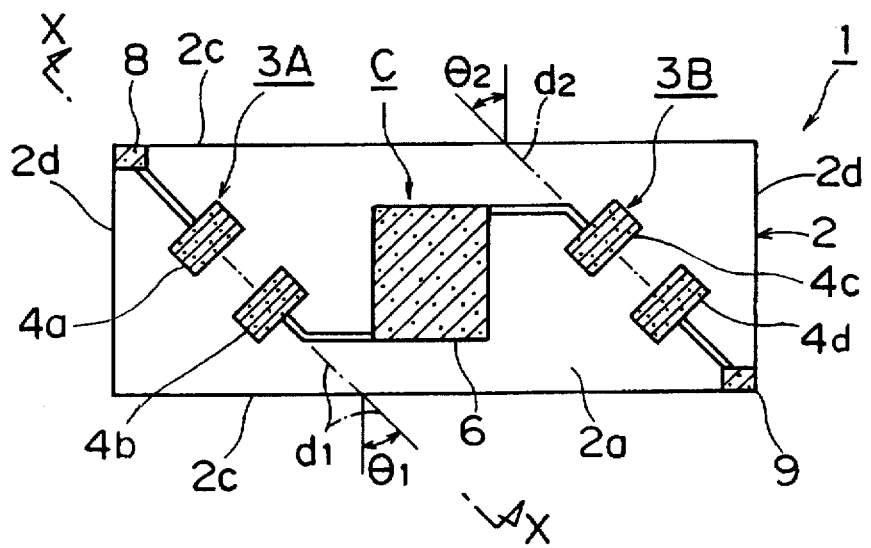
FIG. 1A is a top plan view of a piezoelectric filter according to a first embodiment of the present invention.
Figure 1B:
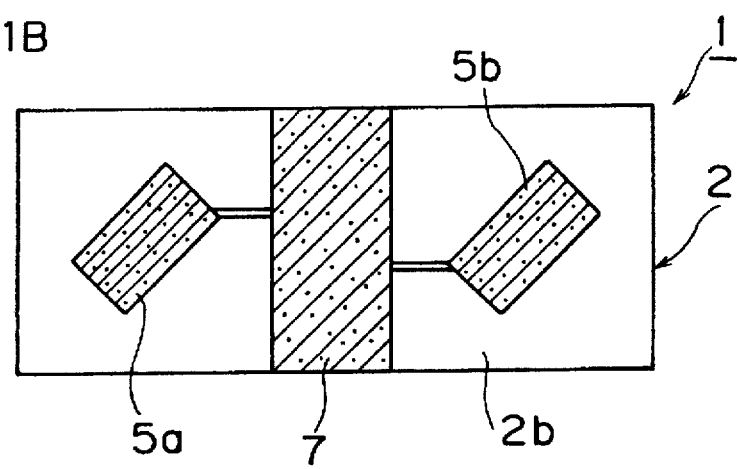
FIG. 1B is a bottom plan view of the piezoelectric filter according to the first embodiment of the present invention.
Figure 1C:
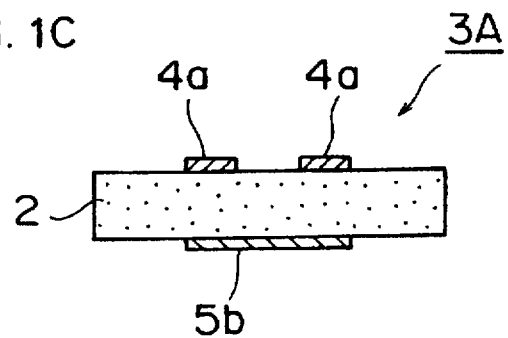
FIG. 1C is a sectional view taken along the line X—X in FIG. 1A.
Figure 8:
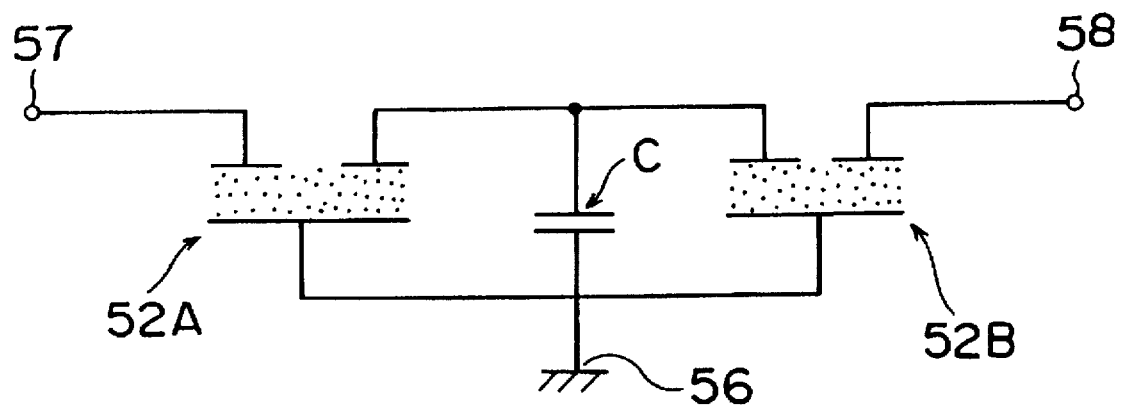
FIG. 8 is an equivalent circuit diagram of the piezoelectric filter shown in FIGS. 7A and 7B.
Figure 9:
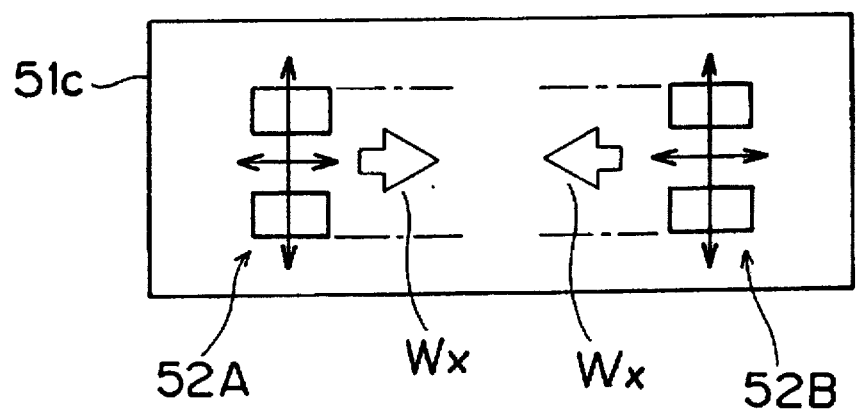
FIG. 9 is a typical top plan view for illustrating a vibration propagation state in the conventional piezoelectric filter.

A piezoelectric filter 1 shown in FIGS. 1A to 1C utilizes fundamental waves, and has a circuit structure which is similar to the equivalent circuit shown in FIG. 8. The piezoelectric filter 1 comprises a rectangular flat plate shaped piezoelectric substrate 2 consisting of PZT or the like, and two vibrating element parts 3A and 3B.

The vibrating element parts 3A and 3B are arranged on longitudinal side portions of an upper surface 2a of the rectangular piezoelectric substrate 2 respectively. The vibrating element part 3A is formed by two vibrating electrodes 4a and 4b, an opposite electrode 5a which is arranged on a back surface 2b of the piezoelectric substrate 2 to be opposed to the vibrating electrodes 4a and 4b, and a portion of the piezoelectric substrate 2 interposed between the electrodes 4a, 4b and 5a.

The vibrating element part 3B comprises a pair of vibrating electrodes 4c and 4d and an opposite electrode 5b, similarly to the vibrating element part 3A.

A capacitor C is arranged between the two vibrating element parts 3A and 3B. This capacitor C comprises a capacitive electrode 6 which is formed on a substantially central portion of the upper surface 2a of the piezoelectric substrate 2, and a ground electrode 7 which is formed on the center of the back surface 2b of the piezoelectric substrate 2. The capacitor C is formed by the capacitive electrode 6, the ground electrode 7 and a portion of the piezoelectric substrate 2 interposed therebetween.

Description is now made on arrangement of the vibrating electrodes 4a, 4b, 4c and 4d of the vibrating element parts 3A and 3B, which characterizes the present invention. In order to further clarify the feature of the present invention, it is assumed that the conventional piezoelectric filter 50 shown in FIGS. 7A and 7B and the piezoelectric filter 1 according to the present invention are identical to each other as to the sizes of the piezoelectric substrates, the electrodes of the vibrating element parts and the capacitors.

As shown in FIG. 1A, the pair of vibrating electrodes 4a and 4b are arranged along an electrode arrangement direction $\alpha_1$ which intersects with longer sides 2c of the piezoelectric substrate 2 at a prescribed angle $\theta_1$. It is assumed that the term "electrode arrangement direction" indicates a direction along which the two vibrating electrodes 4a and 4b are arranged at a constant distance, as shown by a one-dot chain line $\alpha_1$.

Similarly, the pair of vibrating electrodes 4c and 4d are arranged along an electrode arrangement direction $\alpha_2$ which intersects with the longer sides 2c of the piezoelectric substrate 2 at a prescribed angle $\theta_2$.

Figure 7A:
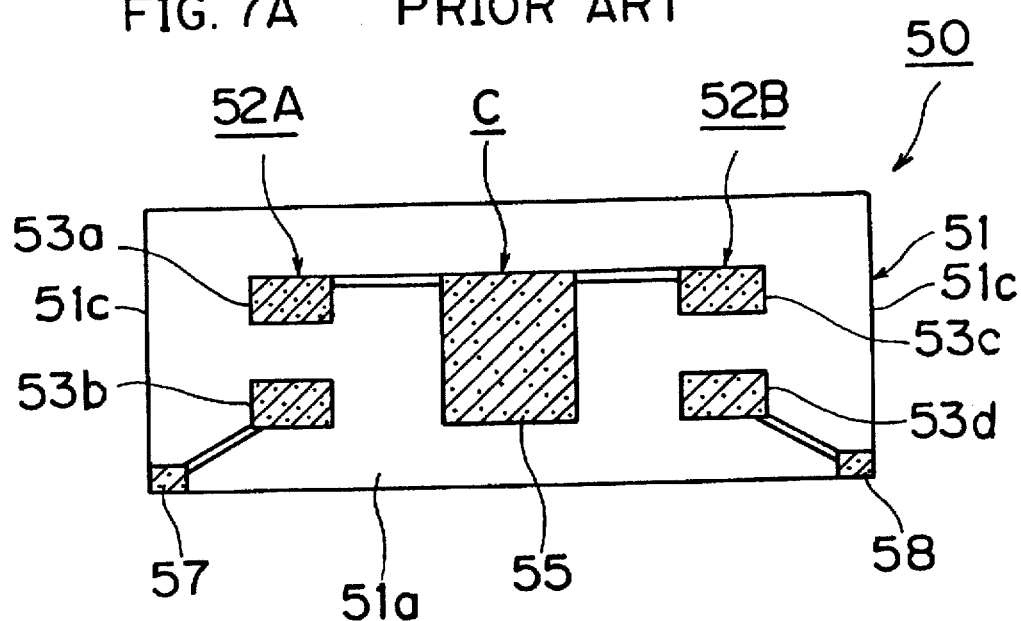
FIG. 7A is a top plan view of a conventional piezoelectric filter.
Figure 7B:
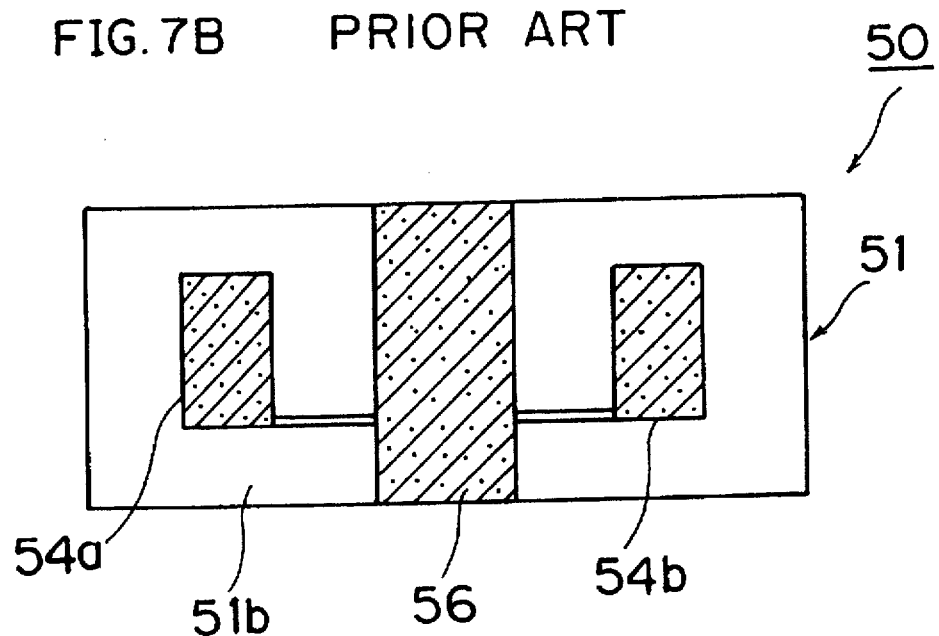
FIG. 7B is a bottom plan view of the conventional piezoelectric filter.

Such arrangement of the vibrating electrodes 4a, 4b, 4c and 4d is implemented by rotating the conventional vibrating electrodes 53a, 53b, 53c and 53d shown in FIG. 7A about central points of the vibrating element parts 52A and 52B by the angles $\theta_1$ and $\theta_2$ respectively, for example, or by rotating the same about some points in the vicinity of the vibrating element parts 52A and 52B. It is clearly understood from FIG. 1A that the state of arrangement of the vibrating electrodes 4a, 4b, 4c and 4d can be implemented without increasing the plane area of the piezoelectric substrate 2.

Figure 2:
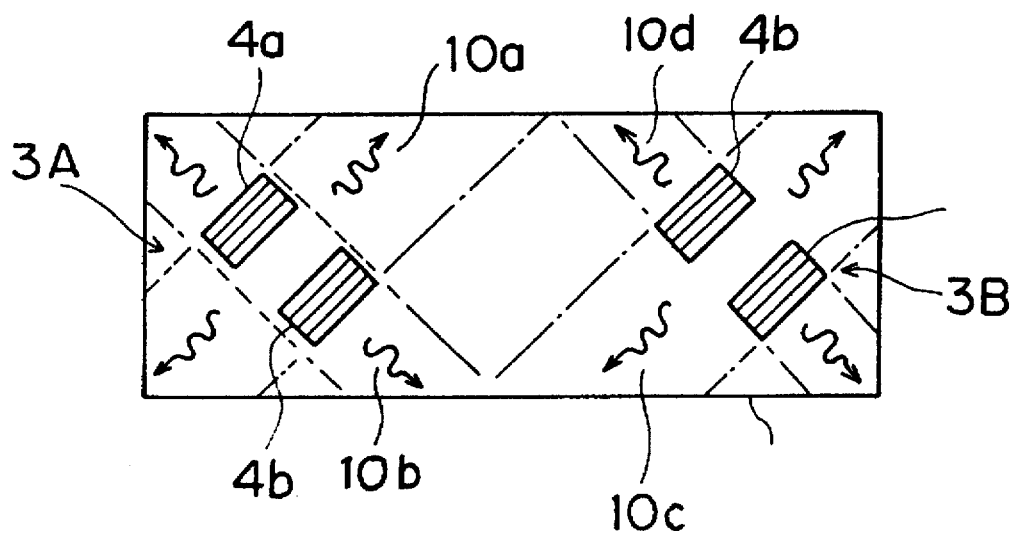
FIG. 2 is a typical top plan view for illustrating a vibration propagation state in the piezoelectric filter according to the first embodiment of the present invention.

The effect of such arrangement of the vibrating electrodes 4a to 4d is now described with reference to FIG. 2. FIG. 2 virtually illustrates propagation regions 10a, 10b, 10c and 10d for spurious vibrations which are caused in the vibrating element parts 3A and 3B. As understood from this figure, the propagation regions 10a to 10d for a plurality of spurious vibrations are prevented from mutual interference due to the arrangement of the vibrating electrodes 4a to 4d of the vibrating element parts 3A and 3B along the directions which are inclined with respect to the longer sides 2c of the piezoelectric substrate 2. Therefore, the spurious vibrations propagated from the vibrating element parts 3A and 3B which are adjacent to each other are prevented from mutual interference, whereby the attenuation of spurious vibration is improved as compared with the prior art. On the basis of this action, the following modes are applicable to the arrangement of the vibrating electrodes 4a to 4d:

(1) The angles $\theta_1$ and $\theta_2$ of inclination of the vibrating electrodes 4a, 4b, 4c and 4d of the vibrating element parts 3A and 3B may be identical to or different from each other.

(2) Considering the concrete shape of the piezoelectric substrate 2, i.e., the rectangular shape, each of the angles $\theta_1$ and $\theta_2$ of inclination is preferably in excess of 0° and not more than 45°.

(3) The electrode arrangement directions $\alpha_1$ and $\alpha_2$ of the vibrating element parts 3A and 3B may be identical to or different from each other with respect to the longer sides 2c of the piezoelectric substrate 2.

(4) The shape of the piezoelectric substrate 2 is not restricted to the rectangular one, but may alternatively be a square one, for example.

Thus, the feature of the present invention resides in that the pairs of vibrating electrodes 4a, 4b, 4c and 4d of the vibrating element parts 3A and 3B are so moved that the propagation regions 10a, 10b, 10c and 10d for the spurious vibrations propagated from the vibrating element parts 3A and 3B will not interfere with each other.

The directions of arrangement of the opposite electrodes 5a and 5b are also inclined following the aforementioned arrangement of the vibrating electrodes 4a to 4d, as a matter of course.

Figure 3:
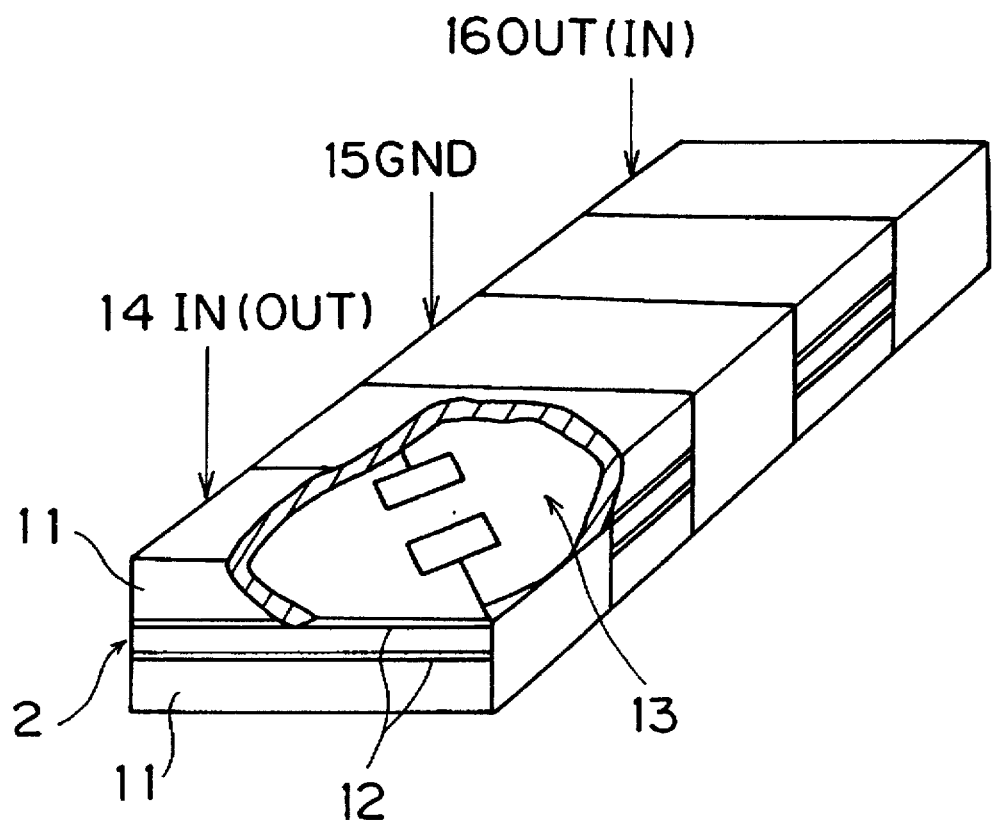
FIG. 3 is a perspective view showing the overall structure of a chip-type piezoelectric filter device employing the piezoelectric filter shown in FIGS. 1A to 1C.

FIG. 3 shows the appearance of a chip-type piezoelectric filter device employing the piezoelectric filter 1 according to the first embodiment of the present invention. In this piezoelectric filter device, hollow box shaped substrates 11 are stacked on upper and lower portions the aforementioned piezoelectric filter 1, and fixed thereto through adhesive layers 12. Input, output and ground electrodes 14, 16 and 15 are formed on outer surfaces of the substrates 11 respectively. Cavities 13 are defined in the substrates 11.

Figure 4:
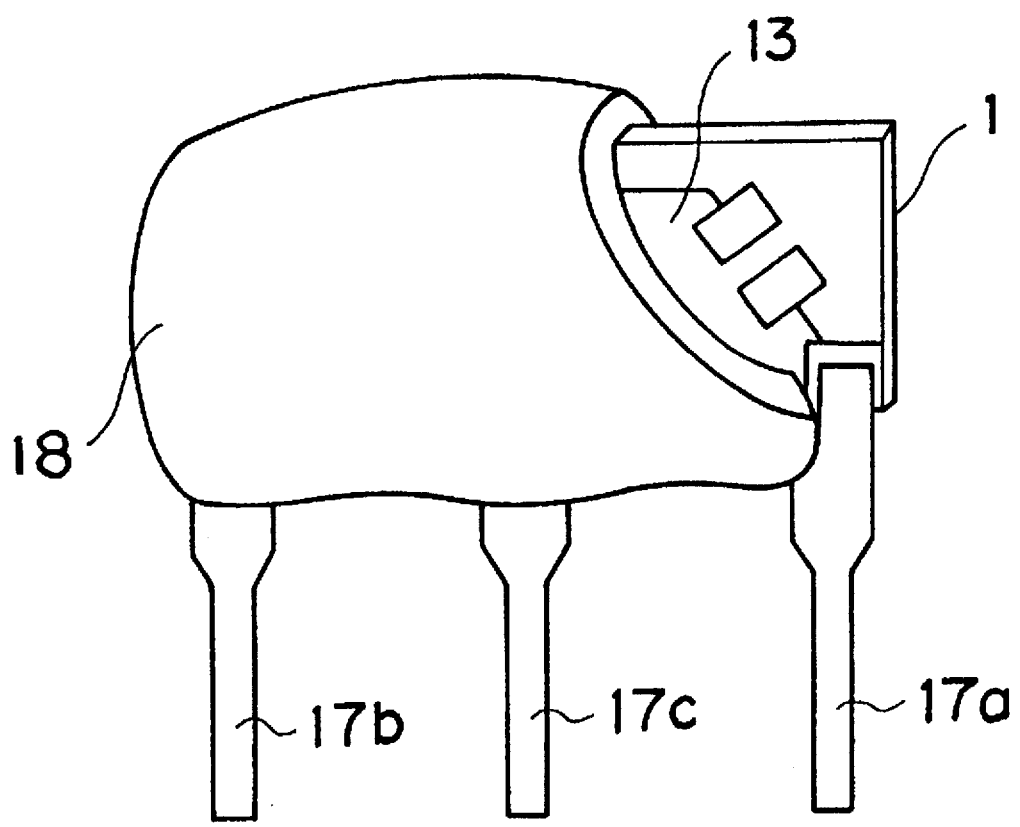
FIG. 4 illustrates the overall structure of a lead-type piezoelectric filter device employing the piezoelectric filter shown in FIGS. 1A to 1C.

FIG. 4 illustrates a lead-type piezoelectric filter device which is implemented by the piezoelectric filter 1 according to the first embodiment of the present invention. The lead-type piezoelectric filter device comprises leads 17a to 17c which are connected to an input electrode 8, an output electrode 9 and a ground electrode 7 of the piezoelectric filter 1 according to the first embodiment respectively, while the periphery of the piezoelectric substrate 2 is covered with a protective resin layer 18 of epoxy resin or the like, to define a cavity 13.

Second Embodiment

Figure 5A:
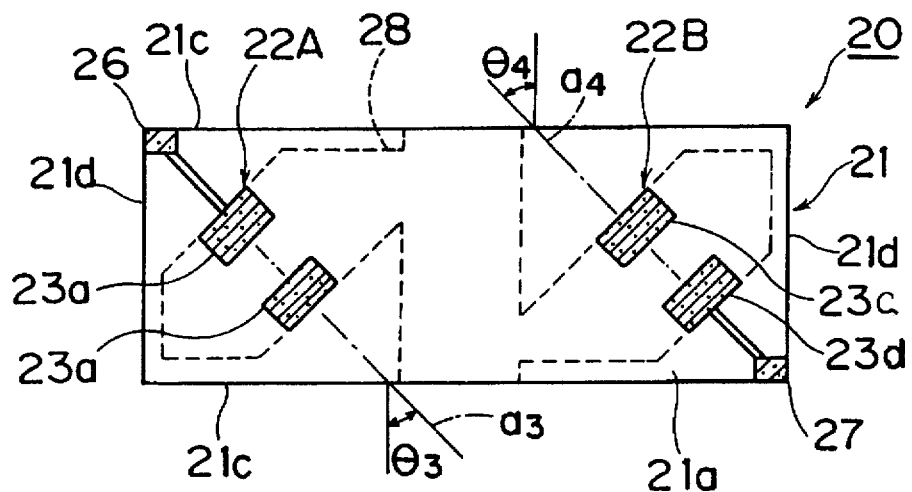
FIG. 5A is a top plan view of a piezoelectric filter according to a second embodiment of the present invention.
Figure 5B:
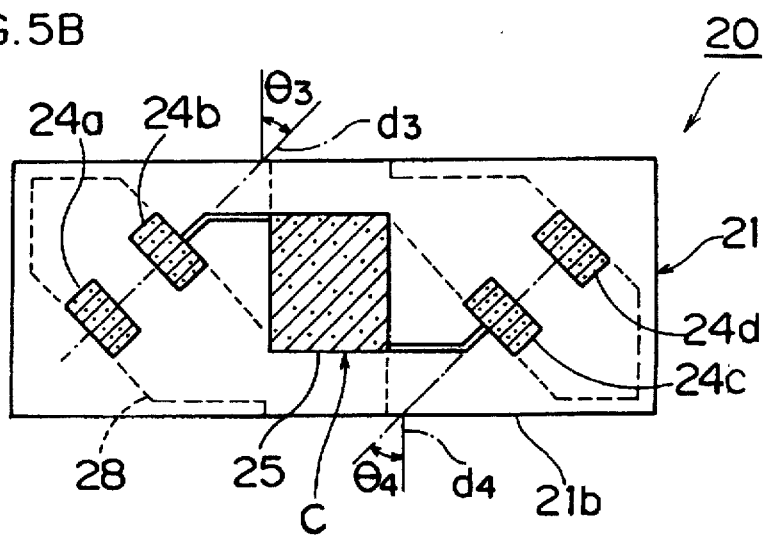
FIG. 5B is a bottom plan view of the piezoelectric filter according to the second embodiment of the present invention.
Figure 5C:
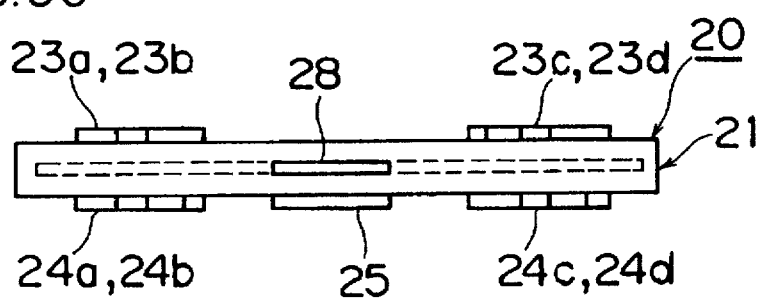
FIG. 5C is a side elevational view of the piezoelectric filter according to the second embodiment of the present invention.

Referring to FIGS. 5A to 5C, a piezoelectric filter 20 according to a second embodiment of the present invention utilizes double waves. The piezoelectric filter 20 comprises a rectangular flat plate shaped piezoelectric substrate 21, and two vibrating element parts 22A and 22B which are arranged on longitudinal end portions of the piezoelectric substrate 21 respectively. The vibrating element part 22A comprises a pair of vibrating electrodes 23a and 23b which are arranged on an upper surface 21a of the piezoelectric substrate 21, and another pair of vibrating electrodes 24a and 24b which are arranged on a back surface 21b of the piezoelectric substrate 21.

The vibrating element part 22B comprises a pair of vibrating electrodes 23c and 23d which are arranged on the upper surface 21a of the piezoelectric substrate 21, and another pair of vibrating electrodes 24c and 24d which are arranged on the back surface 21b of the piezoelectric substrate 21, similarly to the vibrating element part 22A.

An internal electrode 28 is provided in a central portion of the piezoelectric substrate 21 along the thickness direction, to serve both as an opposite electrode and a ground electrode for the vibrating element parts 22A and 22B. A capacitor C is formed by a capacitive electrode 25 which is formed on a central portion of the back surface 21b of the piezoelectric substrate 21, the internal electrode 28 which is opposed to the capacitive electrode 25, and a portion of the piezoelectric substrate 21 interposed therebetween.

Input and output electrodes 26 and 27 are connected with the vibrating electrodes 23a and 23d of the vibrating element parts 22A and 22B respectively.

Similarly to the first embodiment, the vibrating electrodes 23a, 23b, 24a and 24b of the vibrating element part 22A are arranged along an electrode arrangement direction $\alpha_3$ which is inclined at an angle $\theta_3$ of inclination with respect to longer sides 21c of the piezoelectric substrate 21. Further, the vibrating electrodes 23c, 23d, 24c and 24d of the vibrating element part 22B are arranged along an electrode arrangement direction $\alpha_4$ which is inclined at an angle $\theta_4$ of inclination with respect to the longer sides 21c of the piezoelectric substrate 21. Due to such arrangement, it is possible to prevent interference between a plurality of spurious vibrations which are propagated from the vibrating element parts 22A and 22B, similarly to the case shown in FIG. 2.

As to the arrangement of the vibrating electrodes 23a to 23d and 24a to 24d, all conditions (1) to (4) described above with reference to the first embodiment are applicable. Further, it is possible to prevent reduction in spurious attenuation without increasing the plane area of the piezoelectric substrate 21, similarly to the first embodiment.

This piezoelectric filter 20 is also applicable to implement the chip-type and lead-type piezoelectric filter devices shown in FIGS. 3 and 4.

Figure 6:
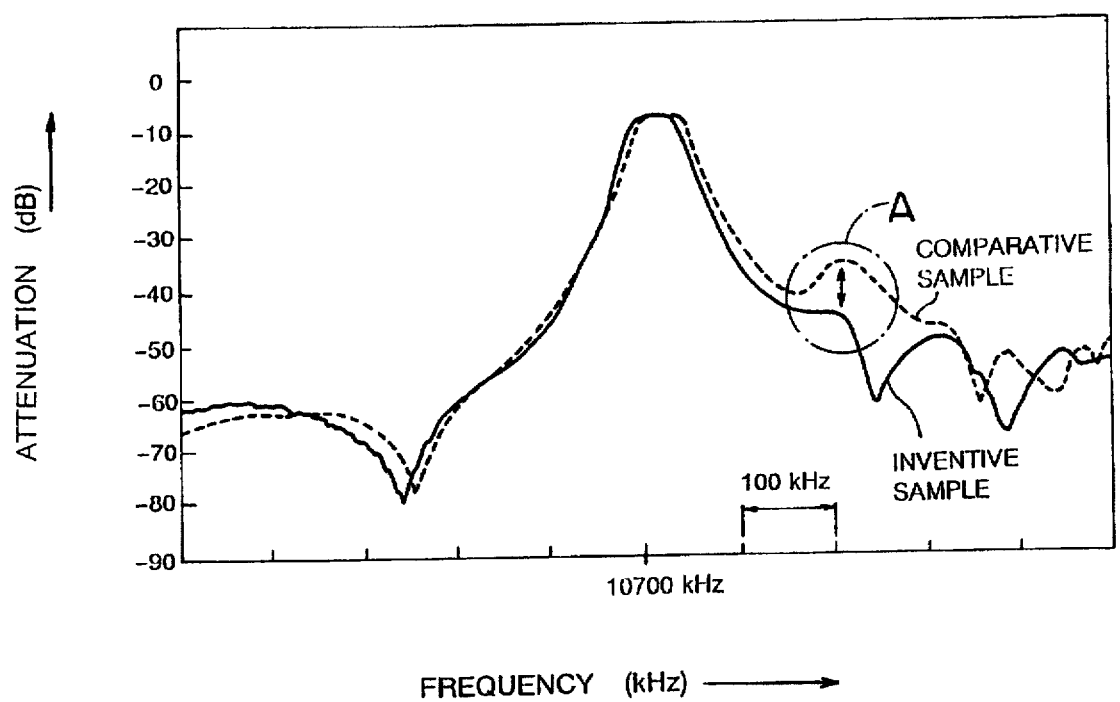
FIG. 6 illustrates frequency characteristics of inventive and comparative samples of piezoelectric filters.

In order to verify the characteristics of the piezoelectric filter according to the present invention, a comparison experiment was made on inventive and comparative samples. The inventive sample was prepared by the piezoelectric filter shown in FIGS. 1A to 1C, while the comparative sample was prepared by that shown in FIGS. 7A and 7B. The piezoelectric substrate was 3 by 7 mm in each sample, while the vibrating electrodes were inclined at angles $\alpha_1$ and $\alpha_2$ of 45° in the inventive sample. FIG. 6 shows frequency characteristics of these samples. Referring to FIG. 6, the axis of abscissas shows frequencies of input waves, and the axis of ordinates shows attenuations of output waves with respect to the input waves. At points A in FIG. 6, the attenuation of the inventive sample is larger than that of the comparative sample by about 10 dB.

Thus, it is understood that the spurious attenuation was improved in the inventive sample as compared with the comparative sample.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric filter comprising:
   a rectangular plate shaped piezoelectric substrate having an upper surface, a back surface and side surfaces connecting said upper surface and said back surface with each other;
   a pair of first vibrating electrodes being arranged on said upper surface of said piezoelectric substrate;
   a pair of second vibrating electrodes being arranged on said upper surface of said piezoelectric substrate to be separated from said first vibrating electrodes; and
   first and second opposite electrodes being formed to be opposed to said pairs of first and second vibrating electrodes respectively through said piezoelectric substrate;
   said pairs of first and second vibrating electrodes and said first and second opposite electrodes forming first and second vibrating element parts respectively,
   said pairs of first and second vibrating electrodes being arranged not to superpose propagation regions for vibrations along directions connecting said vibrating electrodes of said vibrating element parts with each other and those being perpendicular to said directions among vibrations caused in said first and second vibrating element parts, wherein said pairs of first and second vibrating electrodes are arranged at prescribed distances along electrode arrangement directions which are inclined with respect to said side surfaces of said piezoelectric substrate, said electrode arrangement directions being inclined with respect to said side surfaces of said piezoelectric substrate at angles of inclination being in excess of 0° and not more than 45°, and said electrode arrangement directions for said first and second vibrating electrodes of said first and second vibrating element parts being parallel to each other.

2. A piezoelectric filter comprising:
   a rectangular flat plate shaped piezoelectric substrate having an upper surface, a back surface and longitudinal side surfaces connecting said upper surface and said back surface with each other;
   a pair of first vibrating electrodes being arranged on said upper surface of said piezoelectric substrate;
   a pair of second vibrating electrodes being arranged on said upper surface of said piezoelectric substrate to be separated from said first vibrating electrodes; and
   first and second opposite electrodes being formed to be opposed to said pairs of first and second vibrating electrodes respectively through said piezoelectric substrate;
   said pairs of first and second vibrating electrodes and said first and second opposite electrodes forming first and second vibrating element parts respectively,
   said pairs of first and second vibrating electrodes being arranged not to superpose propagation regions for vibrations along directions connecting said vibrating electrodes of said vibrating element parts with each other and those being perpendicular to said directions among vibrations caused in said first and second vibrating element parts wherein said pairs of first and second vibrating electrodes are arranged at prescribed distances along electrode arrangement directions which are inclined with respect to said longitudinal side surfaces of said piezoelectric substrate, said electrode arrangement directions being inclined with respect to said side surfaces of said piezoelectric substrate at angles of inclination being in excess of 0° and not more than 45°, and said electrode arrangement directions for said first and second vibrating electrodes of said first and second vibrating element parts being parallel to each other.

3. The piezoelectric filter in accordance with claim 2, further comprising:
   a capacitive electrode being formed between said first and second vibrating element parts on said upper surface of said piezoelectric substrate, and
   a ground electrode being opposed to said capacitive electrode through said piezoelectric substrate,
   a capacitor being formed by said capacitive electrode and said ground electrode.

4. A piezoelectric filter comprising:
   a rectangular plate shaped piezoelectric substrate having an upper surface, a back surface and side surfaces connecting said upper surface and said back surface with each other;
   a pair of first vibrating electrodes being arranged on said upper surface of said piezoelectric substrate;
   a pair of second vibrating electrodes being arranged on said upper surface of said piezoelectric substrate to be separated from said first vibrating electrodes;
   first and second opposite electrodes being formed to be opposed to said pairs of first and second vibrating electrodes respectively through said piezoelectric substrate;
   said pairs of first and second vibrating electrodes and said first and second opposite electrodes forming first and second vibrating element parts respectively,
   said pairs of first and second vibrating electrodes being arranged not to superpose propagation regions for vibrations along directions connecting said vibrating electrodes of said vibrating element parts with each other and those being perpendicular to said directions among vibrations caused in said first and second vibrating element parts;
   a pair of third vibrating electrodes being arranged on said back surface of said piezoelectric substrate,
   a pair of fourth vibrating electrodes being arranged on said back surface of said piezoelectric substrate to be separated from said third vibrating electrodes,
   said first and second opposite electrodes being formed in said piezoelectric substrate to be opposed to said pairs of third and fourth vibrating electrodes through said piezoelectric substrate respectively,
   said first vibrating element part being formed by said pairs of first and third vibrating electrodes and said first opposite electrode,
   said second vibrating element part being formed by said pairs of second and fourth vibrating electrodes and said second opposite electrode, said pairs of first, second, third and fourth vibrating electrodes being arranged at prescribed distances along electrode arrangement directions which are inclined with respect to said side surfaces of said piezoelectric substrate, said electrode arrangement directions being inclined with respect to said side surfaces of said piezoelectric substrate at angles of inclination being in excess of 0° and not more than 45°, wherein said electrode arrangement directions for said first and second vibrating electrodes of said first and second vibrating element parts are parallel to each other, and said electrode arrangement directions for said third and fourth vibrating electrodes of said first and second vibrating element parts are also parallel to each other.

5. A piezoelectric filter comprising:

a rectangular flat plate shaped piezoelectric substrate having an upper surface, a back surface and longitudinal side surfaces connecting said upper surface and said back surface with each other;

a pair of first vibrating electrodes being arranged on said upper surface of said piezoelectric substrate;

a pair of second vibrating electrodes being arranged on said upper surface of said piezoelectric substrate to be separated from said first vibrating electrodes;

first and second opposite electrodes being formed to be opposed to said pairs of first and second vibrating electrodes respectively through said piezoelectric substrate;

said pairs of first and second vibrating electrodes and said first and second opposite electrodes forming first and second vibrating element parts respectively, said pairs of first and second vibrating electrodes being arranged not to superpose propagation regions for vibrations along directions connecting said vibrating electrodes of said vibrating element parts with each other and those being perpendicular to said directions among vibrations caused in said first and second vibrating element parts;

a pair of third vibrating electrodes being arranged on said back surface of said piezoelectric substrate, a pair of fourth vibrating electrodes being arranged on said back surface of said piezoelectric substrate to be separated from said third vibrating electrodes, said first and second opposite electrodes being formed in said piezoelectric substrate to be opposed to said pairs of third and fourth vibrating electrodes through said piezoelectric substrate respectively, said first vibrating element part being formed by said pairs of first and third vibrating electrodes and said first opposite electrode, said second vibrating element part being formed by said pairs of second and fourth vibrating electrodes and said second opposite electrode, said pairs of first, second, third and fourth vibrating electrodes being arranged at prescribed distances along electrode arrangement directions which are inclined with respect to said longitudinal side surfaces of said piezoelectric substrate, said electrode arrangement directions being inclined with respect to said side surfaces of said piezoelectric substrate at angles of inclination being in excess of 0° and not more than 45°, wherein said electrode arrangement directions for said first and second vibrating electrodes of said first and second vibrating element parts are parallel to each other, and said electrode arrangement directions for said third and fourth vibrating electrodes of said first and second vibrating element parts are also parallel to each other.

6. The piezoelectric filter in accordance with claim 5, further comprising:

a capacitive electrode being formed between said third and fourth vibrating element parts on said back surface of said piezoelectric substrate, and a ground electrode being formed in said piezoelectric substrate to be opposed to said capacitive electrode, a capacitor being formed by said capacitive electrode and said ground electrode.

* * * * *